(12) United States Patent
Li et al.

(10) Patent No.: US 7,877,219 B2
(45) Date of Patent: Jan. 25, 2011

(54) SYSTEM AND METHOD FOR ANALYZING A SIGNAL DISPLAYING A NON-MONOTONIC TRANSITION

(75) Inventors: Shen-Chun Li, Taipei Hsien (TW);
Shou-Kuo Hsu, Taipei Hsien (TW);
Wei-Yuan Chen, Taipei Hsien (TW);
Cho-Hao Wang, Taipei Hsien (TW);
Kuan-Lin Wu, Taipei Hsien (TW);
Hung Chao, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 432 days.

(21) Appl. No.: 12/172,256

(22) Filed: Jul. 13, 2008

(65) Prior Publication Data
US 2009/0024341 A1    Jan. 22, 2009

(30) Foreign Application Priority Data
Jul. 17, 2007    (CN) .................. 2007 1 0201086

(51) Int. Cl.
*G01R 13/02* (2006.01)
(52) U.S. Cl. ........................................................ 702/67
(58) Field of Classification Search .................... 702/67
See application file for complete search history.

(56) References Cited

PUBLICATIONS

Ivan Pastine, Signal Accuracy and Informational Cascades, Feb. 13, 2006, p. 1-19.*

* cited by examiner

*Primary Examiner*—Tung S Lau
(74) *Attorney, Agent, or Firm*—Frank R. Niranjan (57) ABSTRACT

A system for analyzing non-monotonic of signals is provided. The system is configured for receiving a signal and displaying changes of the signal using a waveform curve. The system is configured for analyzing data of the signals and the waveform curve in order to locate peak points on the waveform curve. The system is also configured for storing the signal data and data generated during the analyzing process. A related method is also provided.

9 Claims, 7 Drawing Sheets

SYSTEM AND METHOD FOR ANALYZING A SIGNAL DISPLAYING A NON-MONOTONIC TRANSITION

BACKGROUND

1. Field of the Invention

Embodiments of the present disclosure relates to signal analyzing systems and methods, particularly to a system and method for analyzing a signal displaying a non-monotonic transition.

2. Description of Related Art

Figure 4:
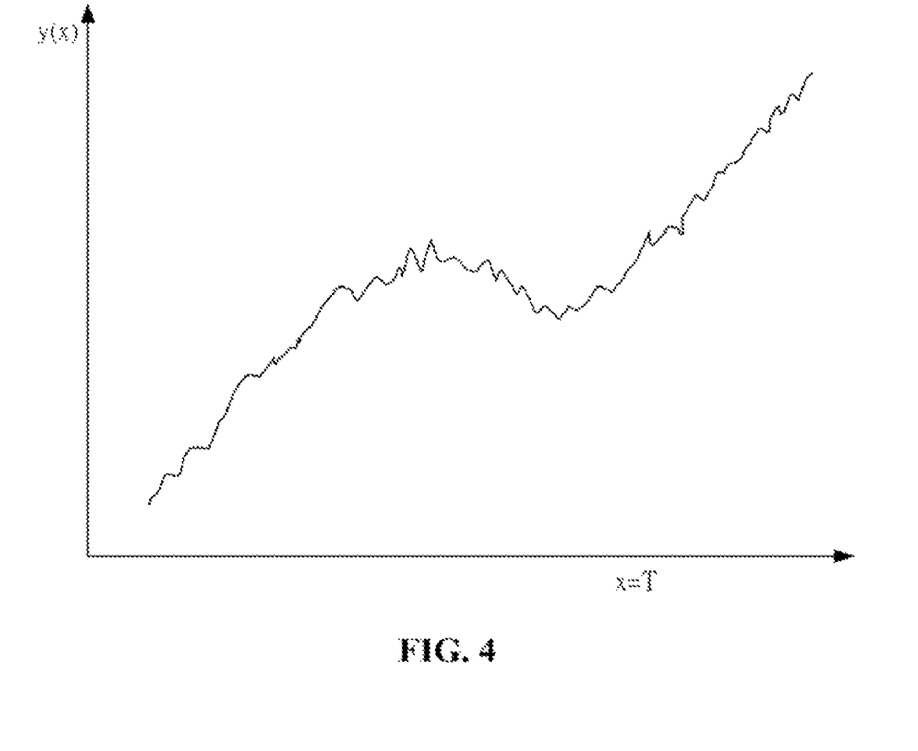
FIG. 4 is a graph of one embodiment of a signal, having jagged waveforms, displaying non-monotonic transitions on an oscillograph.

Signal measuring devices with graphical interfaces, such as electrocardiographs, spectroanalyzers, oscillographs, etc., are widely used in signal measuring. FIG. 4 illustrates one embodiment of a jagged waveform curve displaying non-monotonic transitions. The jagged waveform curve illustrates a gradual ascending curve until reaching a top point, and a descending curve until reaching a bottom point before ascending again from the bottom point. The top point and the bottom point, regarded as peak points on the jagged waveform, are important characteristics for signal measuring. Therefore, it is necessary to identify the peak points precisely. However, present identification of peak points on a non-monotonic waveform curve is done manually, which inevitably result in error.

What is needed, therefore, is a system and method for analyzing non-monotonic transition of signals with a high precision.

SUMMARY

A system for analyzing a signal displaying a non-monotonic transition is provided. The system comprises a data retrieving module, a computing module, a locating module, and a storing module. The data retrieving module is configured for determining an independent parameter value set $[x_i]$ and a dependent parameter value set $[y(x_i)]$ in a transition interval of a waveform curve $y(x)$ of the signal. The computing module configured for determining an approximation function $F(x)$ of the waveform curve $y(x)$, according to the independent parameter value set $[x_i]$ and the dependent parameter value set $[y(x_i)]$, and determining a first discrete value set $[F'(x_i)]$ and a second discrete value set $[F''(x_i)]$ by determining a first order differential and a second order differential of the optimal approximation function $F(x)$ based on the first parameter value set. The locating module is configured for determining if the first discrete value set $[F'(x_i)]$ has one or more zero values. The locating module is further configured for determining if the optimal approximation function $F(x)$ is non-monotonic and determining a peak point $(x_i, F(x_i))$ in the transition interval of the optimal approximation function $F(x)$ according to each zero value, upon the condition that the first discrete value set $[F'(x_i)]$ has one or more zero values. The locating module is still further configured for determining a curvature radius $R$ of each peak point according to a formula $R = |F''(x_i)|^{-1}$, determining an independent parameter range $[x_i-R, x_i+R]$ by regarding each peak point $(x_i, F(x_i))$ as a center. Additionally, the locating module is configured for determining coordinates of each peak point on the waveform curve $y(x)$ by comparing values in the dependent parameter value set $[y(x_i)]$ in each independent parameter range $[x_i-R, x_i+R]$.

Other objects, advantages and novel features will become more apparent from the following detailed description of certain embodiments of the present disclosure when taken in conjunction with the accompanying drawings, in which:

DETAILED DESCRIPTION OF CERTAIN INVENTIVE EMBODIMENTS

Figure 1:
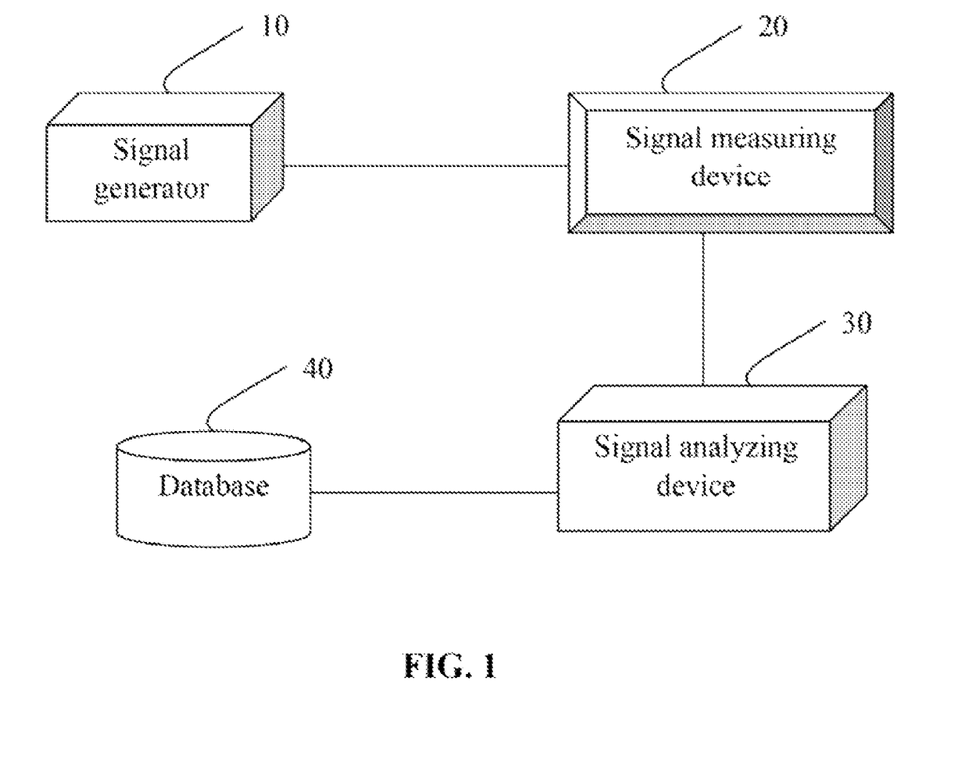
FIG. 1 is a block diagram of one embodiment of a system for analyzing a signal displaying a non-monotonic transition.

FIG. 1 is a block diagram of one embodiment of a system 1 for analyzing a signal displaying a non-monotonic transition. The system 1 may be used to identify peak points in an electrical signal in order to characterize the electrical signal. In one embodiment, the system 1 includes a signal generator 10, a signal measuring device 20, a signal analyzing device 30, and a database 40. The signal measuring device 20 is connected to the signal generator 10 and to the signal analyzing device 30. The database 40 is connected to the signal analyzing device 30.

The signal generator 10 may be any device that can generate electrical signals to be tested. In one exemplary embodiment of the present disclosure, the signal generator 10 is an electronic motherboard that generates signals to be tested, such as a voltage signal. The electronic motherboard may be any motherboard applied in various electronic devices, such as a mobile phone, mobile or desktop computer, or personal digital assistants (PDAs), for example. It may be understood that the electrical signal may comprise a voltage signal or a current signal, for example.

The signal measuring device 20 is configured for receiving the signals generated by the motherboard 10, and displaying signal changes via a waveform curve $y(x)$ (as shown in FIG. 4). In one embodiment, the signal measuring device 20 is an oscillograph for monitoring voltage signals generated by the motherboard 10. However, in other embodiments, the signal measuring device 20 may be an oscilloscope or an electrocardiograph, for example.

The signal analyzing device 30 is configured for analyzing the signals from the signal measuring device 20 in order to locate peak points on the waveform curve $y(x)$.

The database 40 is configured for storing the signal data and other kinds of data generated during the analyzing process.

Figure 2:
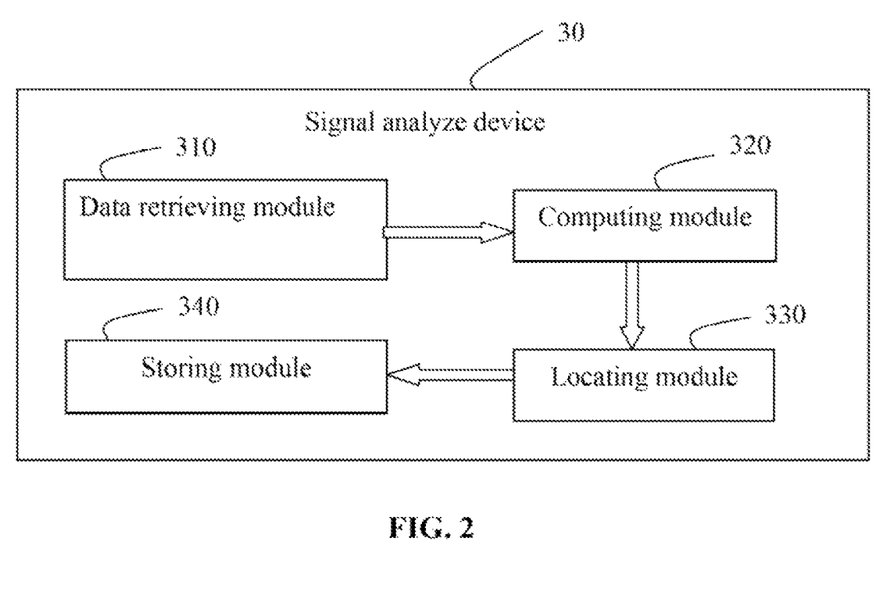
FIG. 2 is a schematic diagram of the signal analyzing device comprising function modules.

FIG. 2 is a schematic diagram of the signal analyzing device 30 comprising function modules. The function modules of the signal analyzing device 30 may be used to analyze points in a signal waveform. In one embodiment, the signal analyzing device 30 comprises a data retrieving module 310, a computing module 320, a locating module 330, and a storing module 340.

The data retrieving module 310 is configured for determining parameters of the waveform curve $y(x)$ and corresponding values of the parameters. In one embodiment, the parameters may include a coordinate axis system where an independent parameter x defines a measured time T, and where the dependent parameter $y(x)$ defines a voltage changed with respect to the measured time T. Furthermore, the parameters may include an independent parameter value set [$x_i$] having a plurality of dispersed numerical values of the independent parameter x, and a dependent parameter value set [$y(x_i)$] having a plurality of dispersed numerical values of the dependent parameter y(x).

Figure 5:
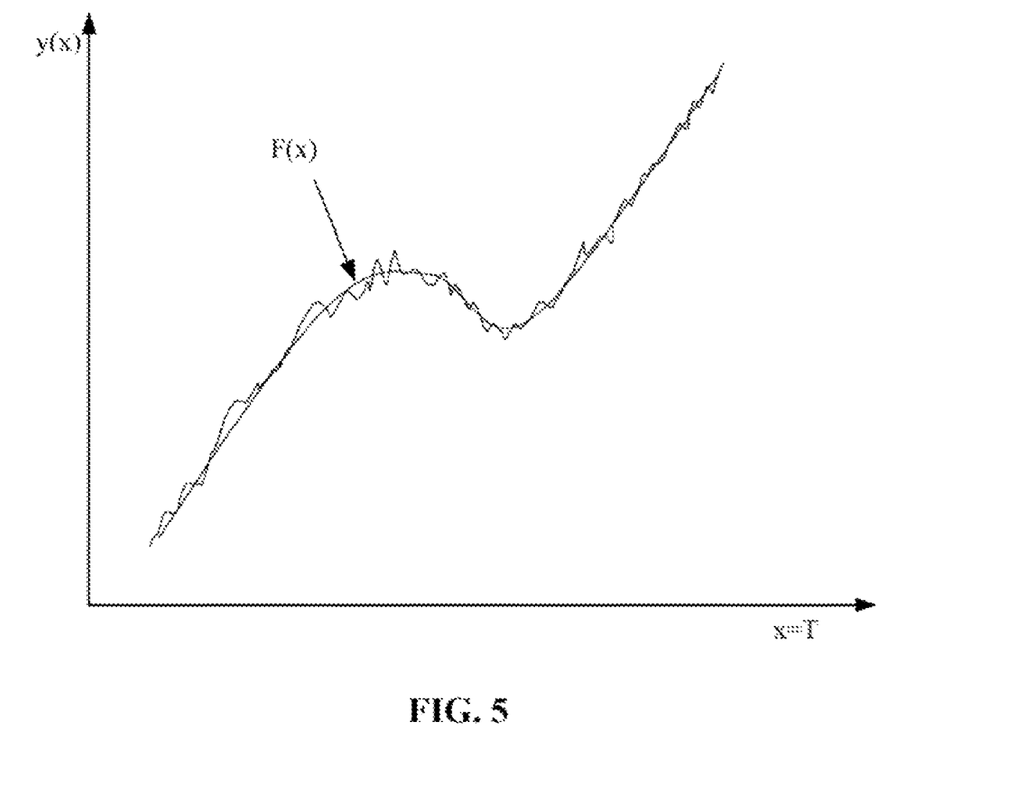
FIG. 5 illustrates one embodiment of an approximation function diagram of the jagged waveform curve in FIG. 4.

The computing module 320 is configured for determining an approximation function F(x) of the waveform curve y(x) according to the independent parameter value set [$x_i$], the dependent parameter value set [$y(x_i)$] and a corresponding mathematical function. In one embodiment, the corresponding mathematical function may be a polynomial function, a trigonometric function, a logarithmic function, or an exponential function. In one exemplary embodiment of the present disclosure, a polynomial function is used for the purpose of illustration. In one embodiment, a general formula of the polynomial function is as follows:

$$F(x) \cong y(x) \equiv \sum_{i=0}^{n-1} a_i \cdot x^i = a_0 + a_1 \cdot x^1 + a_2 \cdot x^2 + \ldots + a_{n-1} \cdot x^{n-1},$$

wherein n is a natural number (i.e., $0 \leq i \leq n-1$), and $a_{n-1}$ is a polynomial coefficient. The computing module 320 determines an expression of the approximation function F(x) by determining a coefficient matrix [$a_i$], which makes a minimum variance $$D \equiv \frac{1}{m} \cdot \sum_{i=0}^{m-1} [F(x_i) - y(x_i)]^2$$

of the approximation function F(x) and the waveform curve y(x). FIG. 5 illustrates one embodiment of a curve of the approximation function F(X) of the waveform curve y(x)).

Figure 6:
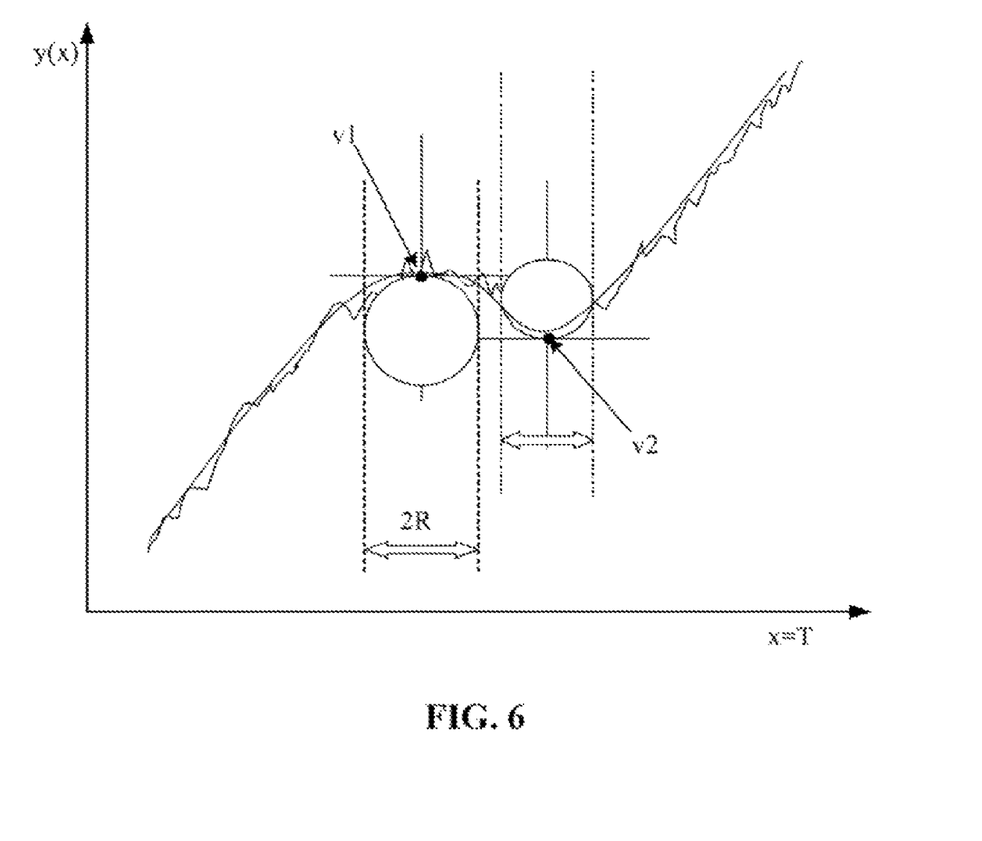
FIG. 6 is a diagram of one embodiment for illustrating peak points on the approximation function diagram in FIG. 5.

The computing module 320 is further configured for determining a first order differential $$F'(x_i) = \frac{dF}{dx} = \sum_{i=0}^{n-1} \left( \frac{F(x_{i+1}) - F(x_i)}{x_{i+1} - x_i} \right)$$

and a second order differential $$F''(x) = \frac{dF'}{dx} = \sum_{i=0}^{n-1} \left( \frac{F'(x_{i+1}) - F'(x_i)}{x_{i+1} - x_i} \right)$$

of the approximation function F(x) in the transition interval based on the first dispersed value set [$x_i$], so as to determine a first discrete value set [$F'(x_i)$] and a second discrete value set [$F''(x_i)$], respectively. It may be understood that each first discrete value $F'(x_i)$ defines a rate of slope of each discrete point on the optimal approximation function F(x), and each second discrete value $F''(x)$ defines a curvature of each discrete point on the approximation function F(x) in the transition interval. It is noted that a discrete point ($x_i, F(x_i)$) is a peak point on a wave hollow (i.e., a point v2 as shown in FIG. 6) if $F''(x_i) > 0$. It is also noted that the discrete point ($x_i, F(x_i)$) is a peak point on a wave crest (i.e. a point v1 as shown in FIG. 6) if $F''(x_i) < 0$.

The locating module 330 is configured for determining whether the first discrete value set [$F'(x_i)$] has one or more zero values (i.e., $F'(x_i) = 0$). Furthermore, the locating module is configured for determining if the optimal function F(x) is non-monotonic, and is configured for determining a corresponding peak point ($x_i, F(x_i)$) (i.e., the point v1 or v2 as shown in FIG. 6) on the optimal approximation function F(x) according to each zero value, if the first discrete value set [$F'(x_i)$] has at least one zero value. For example, if the first discrete value set [$F'(x_i)$] has two zero values, then two corresponding peak points ($x_i, F(x_i)$) are determined.

Figure 7:
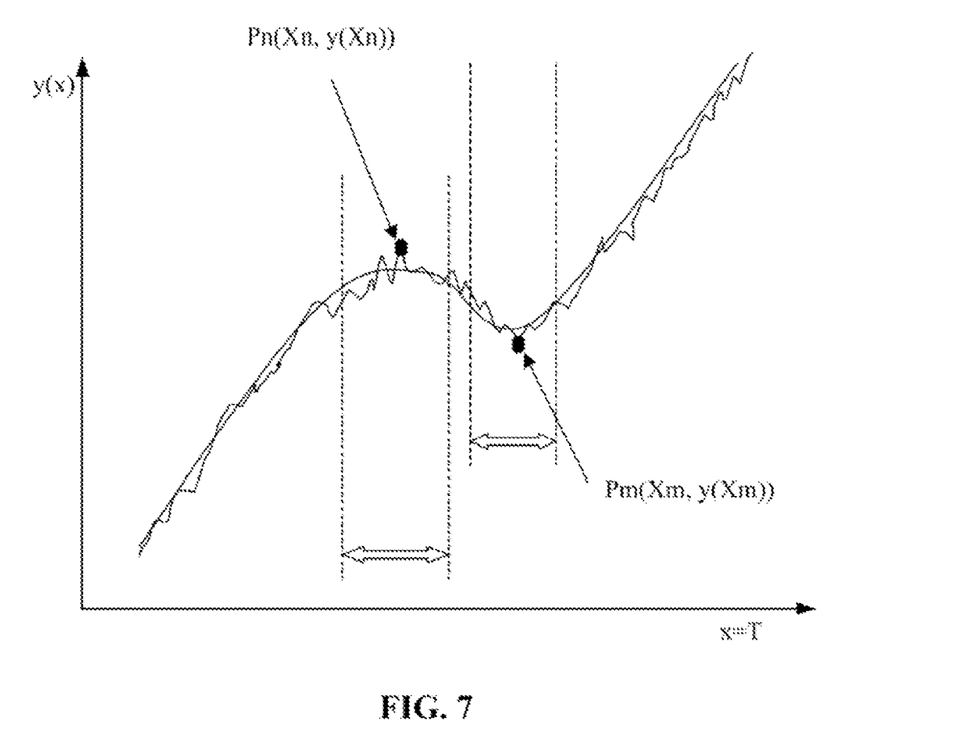
FIG. 7 is a diagram of one embodiment for illustrating peak points on the jagged waveform curve.

The locating module 330 is further configured for determining a curvature radius R of each peak point according to a formula $R = |F''(x_i)|^{-1}$. Furthermore, the locating module is further configured for determining an independent parameter range [$x_i-R, x_i+R$] by regarding each peak point ($x_i, F(x_i)$) as a center, and determining coordinates of each peak point on the waveform curve y(x) (i.e. $P_m(x_m, y(x_m))$, $P_n(x_n, y(x_n))$ as shown in FIG. 7) by comparing values in the dependent parameter value set [$y(x_i)$] in each independent parameter range [$x_i-R, x_i+R$].

The storing module 340 is configured for storing the coordinates of the peak points on the waveform curve y(x) and other related data in the database 40.

Figure 3:
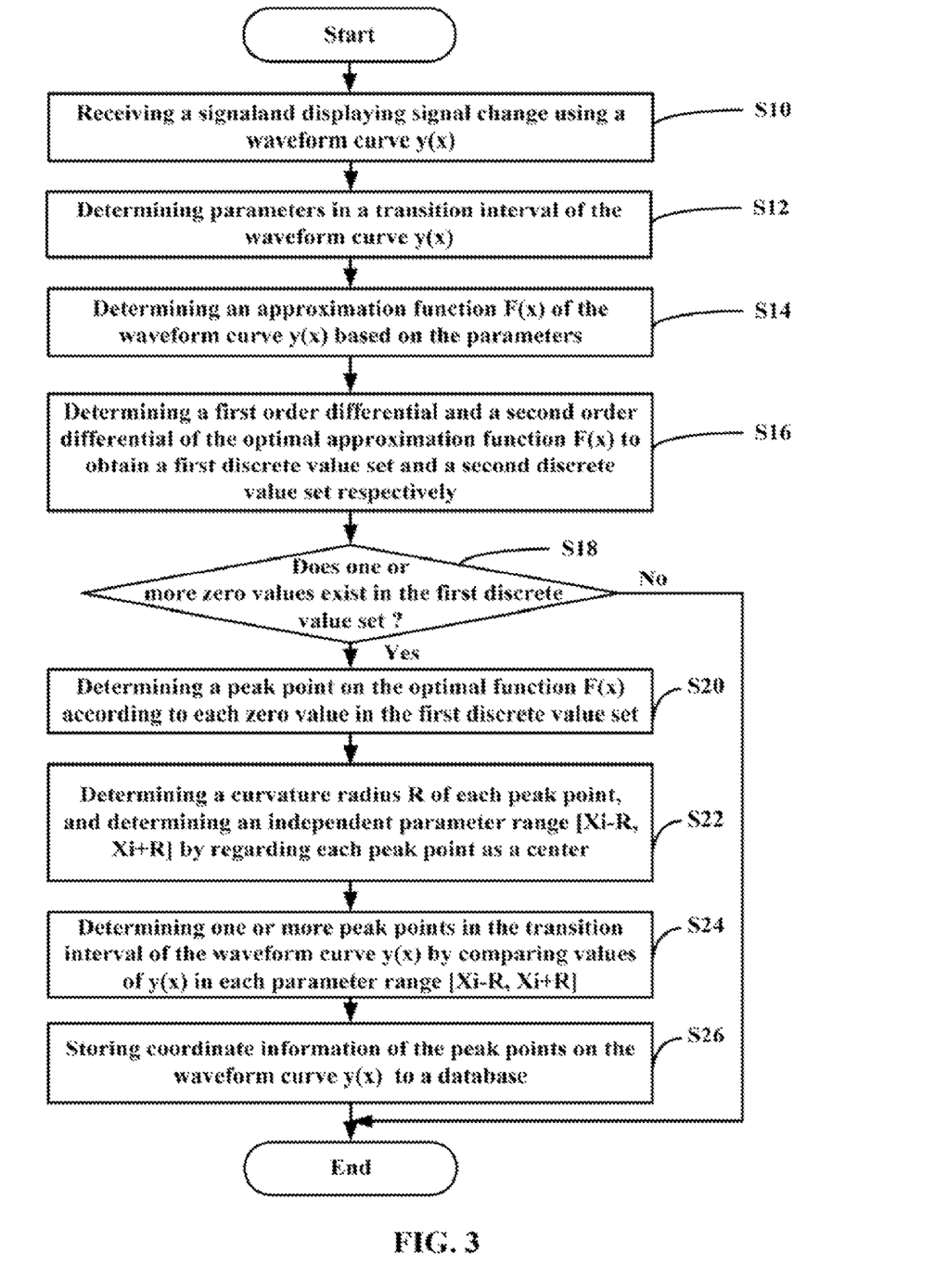
FIG. 3 is a flowchart of one embodiment of a method for analyzing a signal displaying non-monotonic transition.

FIG. 3 is a flowchart of one embodiment of a method for analyzing a signal displaying non-monotonic transitions. The method of FIG. 3 may be used to compute characteristic values for various signals displayed by an oscillograph, for example. Depending on the embodiment, additional blocks may be added, others removed, and the ordering of the blocks may be changed.

In block S10, the signal measurement device 20 receives signals generated by the motherboard 10, and displays signal changes of the waveform using a waveform curve y(x) on a display interface of the oscillograph 20.

In block S12, the data retrieving module 310 retrieves parameters of the waveform curve y(x) and values of the parameters, such as an independent parameter x, the dependent parameter y(x), an independent parameter value set [$x_i$] having a plurality of dispersed numerical values of the independent parameter x, and a dependent parameter value set [$y(x_i)$] having a plurality of dispersed numerical values of the dependent parameter y(x), in a transition interval of the waveform curve y(x). In one embodiment, the independent parameter x represents a time T, and the dependent parameter y(x) represents voltage V varied along with the measured time T (as shown in FIG. 4).

In block S14, the computing module 320 determines an approximation function F(x) of the waveform curve y(x) according to the independent parameter value set [$x_i$], the dependent parameter value set [$y(x_i)$] and a mathematical function, such as a polynomial function, a trigonometric function, a logarithmic function, or a exponential function as mentioned above.

In block S16, the computing module 320 determines a first order differential and a second order differential of the approximation function F(x) based on the independent parameter value set [$x_i$], to determine a first discrete value set [$F'(x_i)$] and a second discrete value set value set [$F''(x_i)$].

In block S18, the locating module 330 determines if the first discrete value set [$F'(x_i)$] has one or more zero value ($F'(x_i) = 0$). If the first discrete value set [$F'(x_i)$] has at least one zero value, in block S20, the locating module 330 determines that the approximation function F(x) is non-monotonic, and determines a corresponding peak point (i.e. the point v1 or v2 as shown in FIG. 6) on the optimal approximation function F(x) according to each zero value. For example, if the first discrete value set [$F'(x_i)$] has two zero values, then two corresponding peak points ($x_i, F(x_i)$) are determined.

In block S22, the locating module 330 determines a curvature radius R of each peak point, and determines an independent parameter range [$x_i-R, x_i+R$] by regarding each peak point ($x_i, F(x_i)$) as a center.

In block S24, the locating module 330 determines coordinates of each peak point on the waveform curve y(x) as shown in FIG. 7) by comparing values in the dependent parameter value set $[y(x_i)]$ in each independent parameter range $[x_i-R, x_i+R]$.

In block S26, the storing module 340 stores the coordinates of the peak points on the waveform curve y(x) into the database 40.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A system for analyzing a signal displaying a non-monotonic transition, comprising:
   a data retrieving module configured for determining an independent parameter value set $[x_i]$ and a dependent parameter value set $[y(x_i)]$ in a transition interval of a waveform curve y(x) of the signal;
   a computing module configured for:
     determining an approximation function F(x) of the waveform curve y(x) according to the independent parameter value set $[x_i]$ and the dependent parameter value set $[y(x_i)]$, and
     determining a first discrete value set $[F'(x_i)]$ and a second discrete value set $[F''(x_i)]$ by determining a first order differential and a second order differential of the optimal approximation function F(x) based on the first parameter value set $[x_i]$; and
   a locating module configured for:
     determining if the first discrete value set $[F'(x_i)]$ has one or more zero values,
     determining if the optimal approximation function F(x) is non-monotonic and determining a peak point $(x_i, F(x_i))$ in the transition interval of the optimal approximation function F(x) according to each zero value, upon the condition that the first discrete value set $[F'(x_i)]$ has one or more zero values,
     determining a curvature radius R of each peak point according to a formula $R=|F''(x_i)|^{-1}$,
     determining an independent parameter range $[x_i-R, x_i+R]$ by regarding each peak point $(x_i, F(x_i))$ as a center, and
     determining coordinates of each peak point on the waveform curve y(x) by comparing values in the dependent parameter value set $[y(x_i)]$ in each independent parameter range $[x_i-R, x_i+R]$.

2. The system as claimed in claim 1, wherein n is a natural number, and $0 \leq i \leq n-1$.

3. The system as claimed in claim 1, further comprising a storing module configured for storing the coordinates of peak points on the waveform curve y(x) into a database.

4. A method for a processor to analyze a signal displaying a non-monotonic transition of comprising:
   (a) receiving the signal and displaying signal changes of the signal using a waveform curve Y(X);
   (b) determining an independent parameter value set $[x_i]$ and a dependent parameter value set $[y(x_i)]$ in a transition interval of the waveform curve y(x);
   (c) determining an approximation function F(x) of the waveform curve y(x) according to the independent parameter value set $[x_i]$ and the dependent parameter value set $[y(x_i)]$;
   (d) determining a first discrete value set $[F'(x_i)]$ and a second discrete value set $[F''(x_i)]$ by determining a first order differential and a second order differential of the approximation function F(x) based on the independent parameter value set $[x_i]$;
   (e) determining if the first discrete value set $[F'(x_i)]$ has one or more zero values;
   (f) determining if the approximation function F(x) is non-monotonic and determining a peak point $(x_i, F(x_i))$ in the transition interval of the approximation function F(x) according to each zero value, upon the condition that the first discrete value set $[F'(x_i)]$ has one or more zero values;
   (g) determining a curvature radius R of each peak point according to a formula $R=|F''(x_i)|^{-1}$;
   (h) determining an independent parameter range $[x_i-R, x_i+R]$ by regarding each peak point $(x_i, F(x_i))$ as a center; and
   (i) determining coordinates of each peak point on the waveform curve y(x) by comparing values in the dependent parameter value set $[y(x_i)]$ in each independent parameter range $[x_i-R, x_i+R]$.

5. The method as claimed in claim 4, wherein n is a natural number, and $0 \leq i \leq n-1$.

6. The method as claimed in claim 4, further comprising: storing the coordinates of the peak points on the waveform curve y(x) into a database.

7. A non-transitory tangible computer-readable medium having stored thereon instructions for analyzing a signal displaying a non-monotonic transition of, the non-transitory tangible computer-readable medium, when executed by a computer, causing the computer to:
   (a) determining an independent parameter value set $[x_i]$ and a dependent parameter value set $[y(x_i)]$ in a transition interval of a waveform curve y(x);
   (b) determining an approximation function F(x) of the waveform curve y(x) according to the independent parameter value set $[x_i]$ and the dependent parameter value set $[y(x_i)]$;
   (c) determining a first discrete value set $[F'(x_i)]$ and a second discrete value set $[F''(x_i)]$ by determining a first order differential and a second order differential of the approximation function F(x) based on the independent parameter value set $[x_i]$;
   (d) determining if the first discrete value set $[F'(x_i)]$ has one or more zero values,
   (e) determining if the optimal approximation function F(x) is non-monotonic, and determining a peak point $(x_i, F(x_i))$ in the transition interval of the approximation function F(x) according to each zero value, upon the condition that the first discrete value set $[F'(x_i)]$ has one or more zero values;
   (f) determining a curvature radius R of each peak point according to a formula
   (g) determining an independent parameter range $[x_i-R, x_i+R]$ by regarding each peak point $(x_i, F(x_i))$ as a center, and
   (h) determining coordinates of each peak point on the waveform curve y(x) by comparing values in the dependent parameter value set $[y(x_i)]$ in each independent parameter range $[x_i-R, x_i+R]$.

8. The computer-readable medium as claimed in claim 7, wherein n is a natural number, and $0 \leq i \leq n-1$.

9. The computer-readable medium as claimed in claim 7, further comprising: storing the coordinates of the peak points on the waveform curve y(x) into a database.

* * * * *